(12) United States Patent
Pribetich

(10) Patent No.: US 6,233,723 B1
(45) Date of Patent: *May 15, 2001

(54) CIRCUIT BEHAVIORAL INFORMATION ANALYSIS APPARATUS AND A METHOD OF ANALYZING BEHAVIORAL INFORMATION OF A CIRCUIT

(75) Inventor: Olivier Pribetich, Vallauris (FR)

(73) Assignee: VLSI Technology, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/919,529

(22) Filed: Aug. 28, 1997

(51) Int. Cl.[7] .............................. G06F 17/50; H03K 19/00
(52) U.S. Cl. .................................... 716/17; 716/4; 716/5; 703/15
(58) Field of Search .................. 395/500.18; 703/15; 716/4, 5, 17

(56) References Cited

U.S. PATENT DOCUMENTS 5,084,824 * 1/1992 Lam et al. ...................... 395/500.12
5,416,719   5/1995 Pribetich .
5,426,770 * 6/1995 Nuber .............................. 395/500.36
5,440,568 * 8/1995 Foster .............................. 395/500.04

OTHER PUBLICATIONS

Bonnardel, Jorge and Phillippe Raphalen, "Euro Asic '92," The Institute of Electrical and Electronics Engineers, Inc., 1992.

"VHDL Initiative Toward ASIC Libraries: Model Development Specification," VITAL, Mar. 25, 1984.

* cited by examiner

Primary Examiner—Kevin J. Teska
Assistant Examiner—Hugh Jones
(74) Attorney, Agent, or Firm—Wells, St. John, Roberts, Gregory & Matkin, P.S.

(57) ABSTRACT

The present invention provides stimuli generators, methods of analyzing a cell, methods of generating at least one stimuli, and methods of characterizing delay of a cell. One method of analyzing a cell in accordance with the invention includes providing a truth table which includes plural lines defining the logical behavior of a cell, the truth table comprising stimulus for application to the cell and output information generated by the cell responsive to applied stimulus; providing a preselected condition; and selectively extracting at least one stimuli from the truth table responsive to the preselected condition.

23 Claims, 9 Drawing Sheets

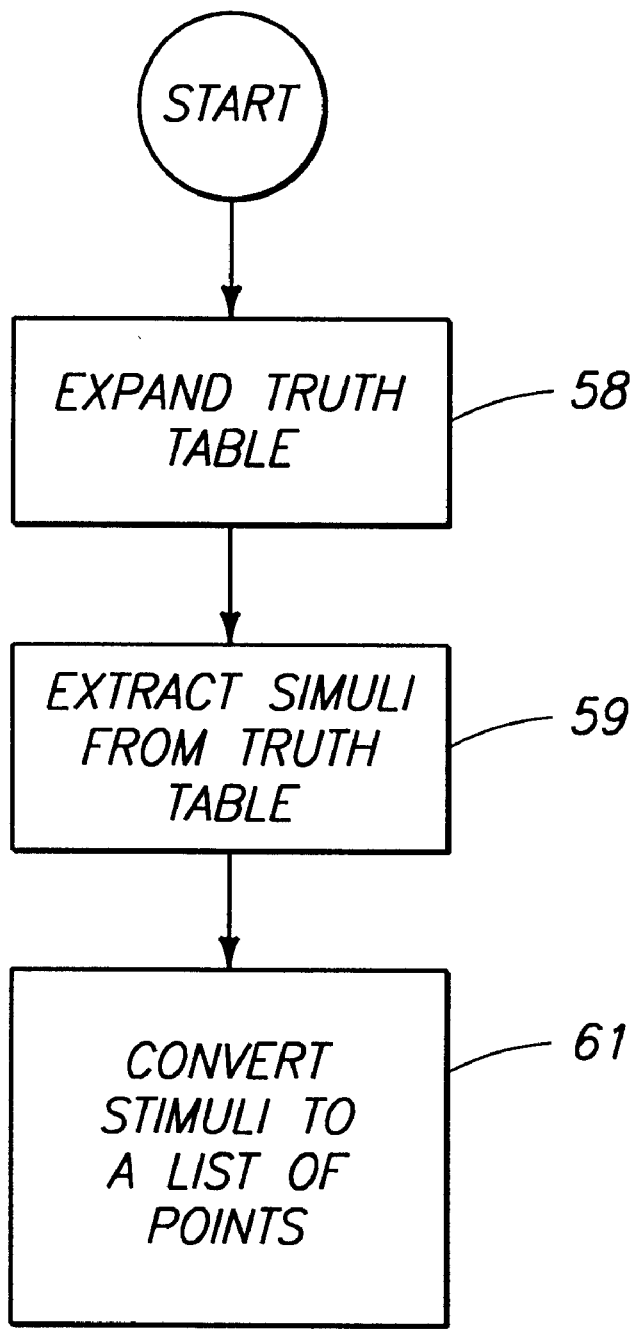

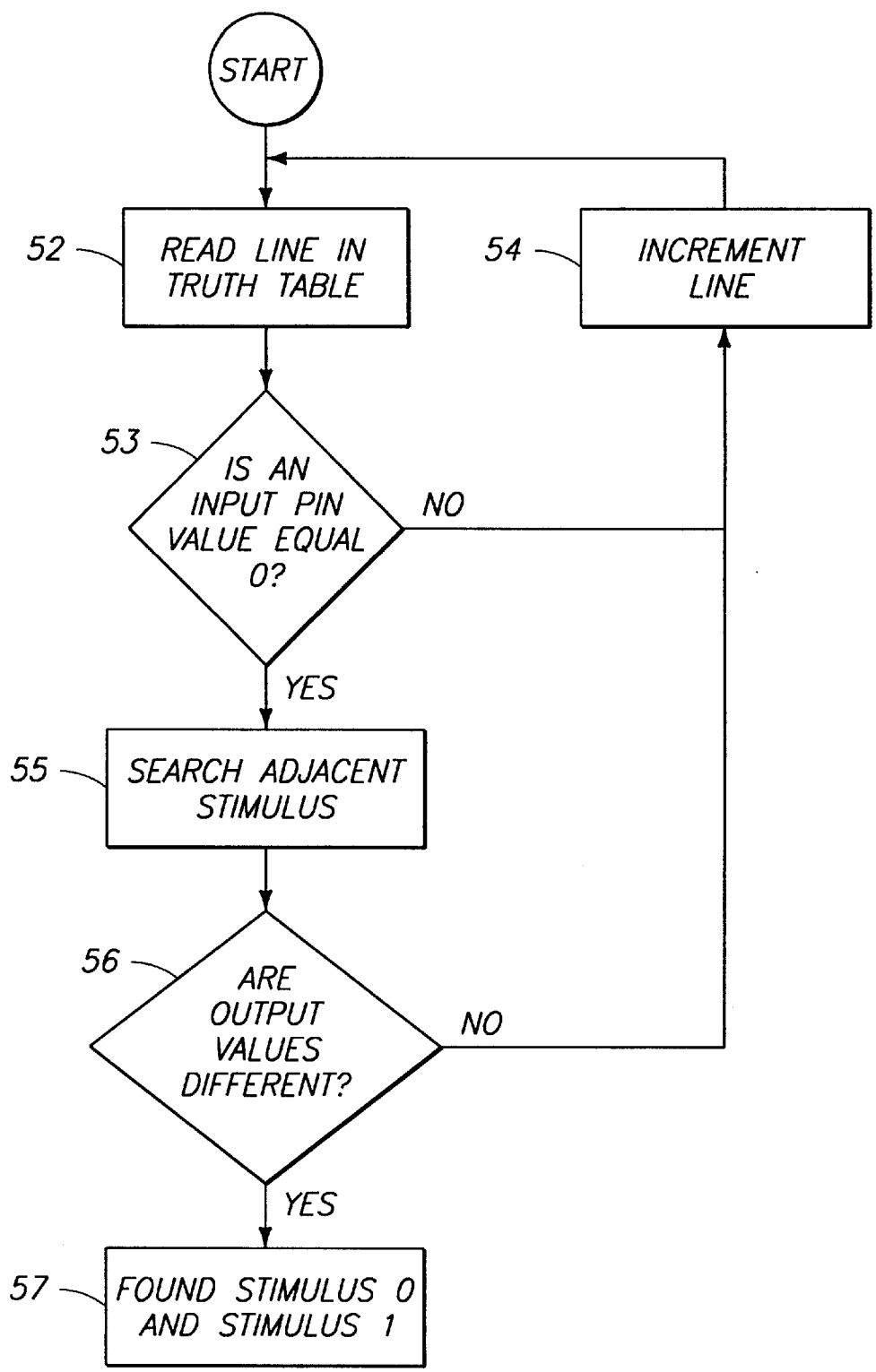

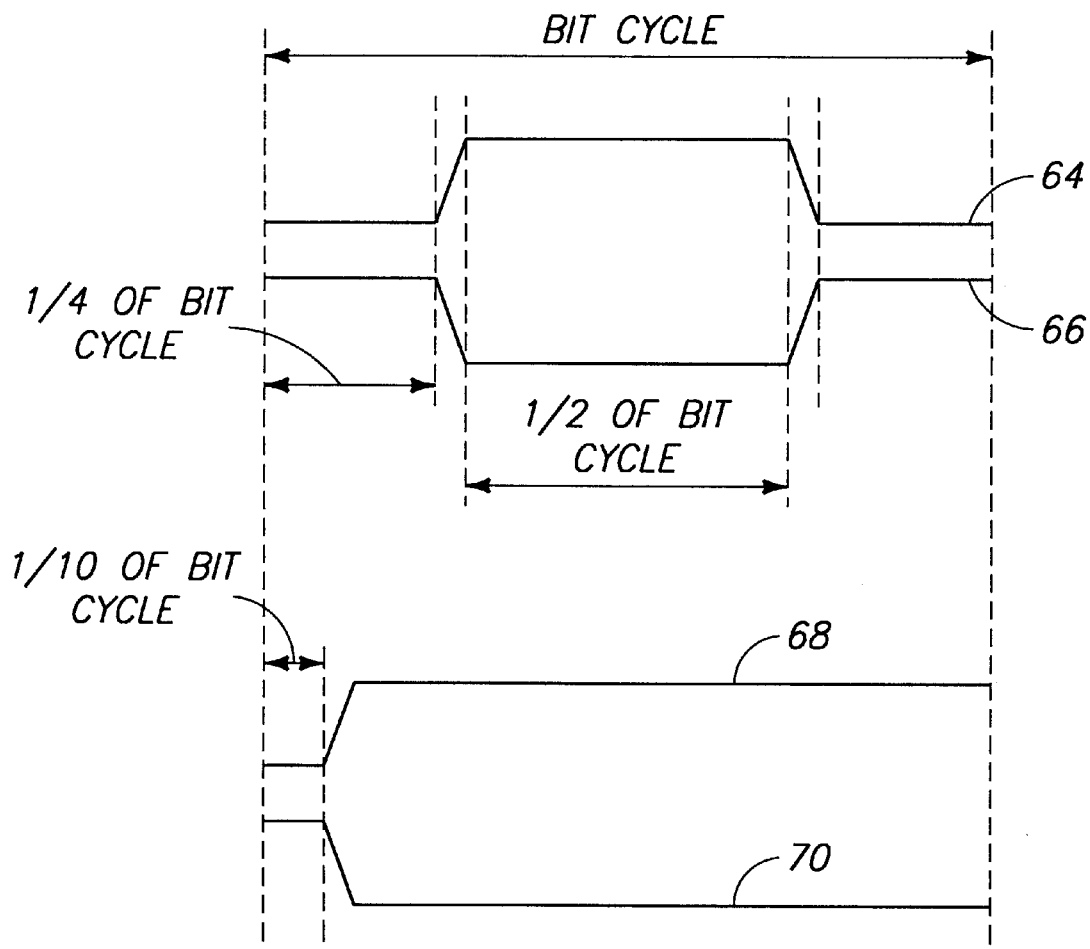

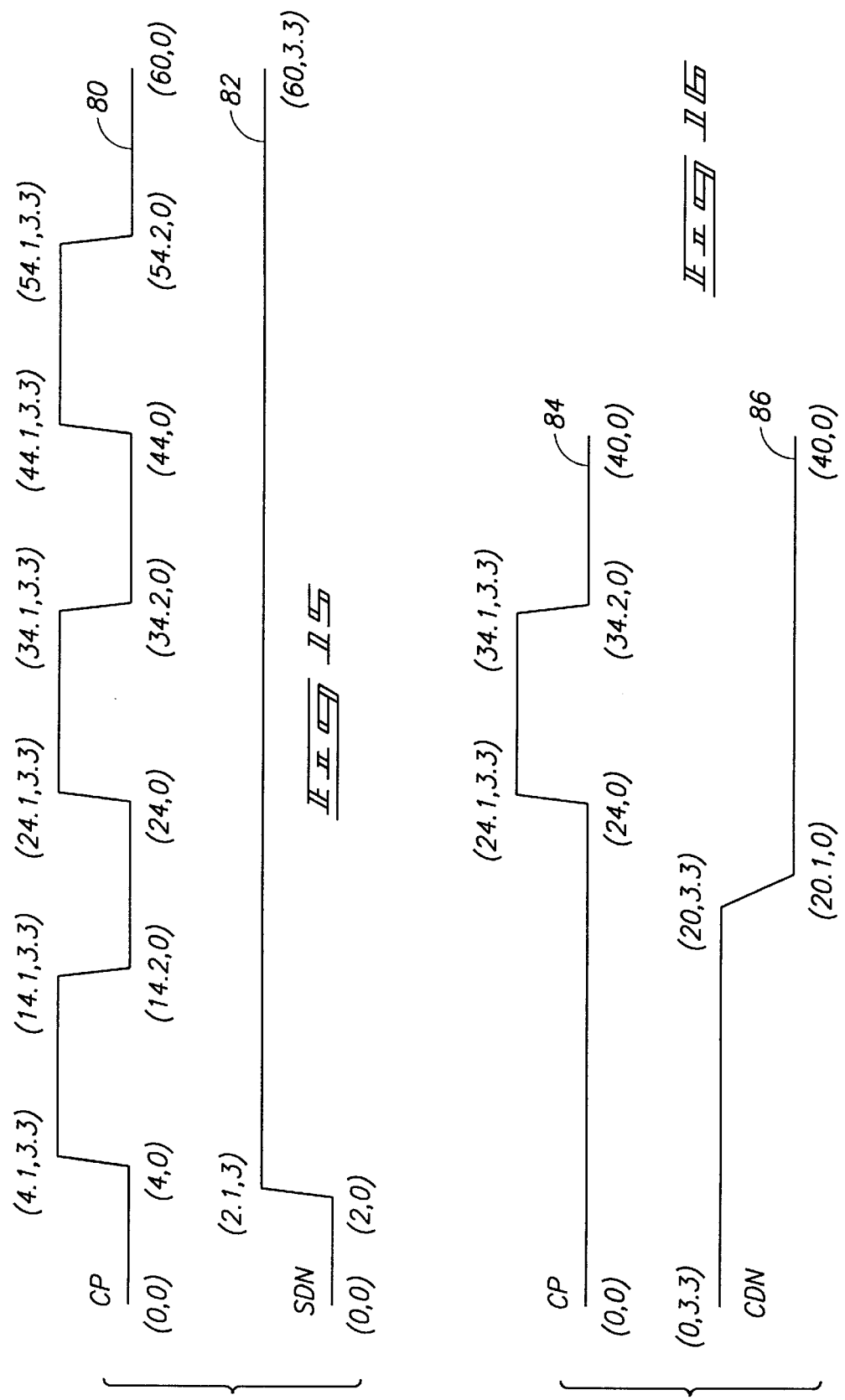

CIRCUIT BEHAVIORAL INFORMATION ANALYSIS APPARATUS AND A METHOD OF ANALYZING BEHAVIORAL INFORMATION OF A CIRCUIT

TECHNICAL FIELD

The present invention relates to stimuli generators and methods of analyzing a cell, generating at least one stimuli, and characterizing delay of a cell.

BACKGROUND OF THE INVENTION

As the demand for application specific integrated circuits, often if referred to as ASICs, has continued to increase, so has the demand for design methodologies for forming these integrated circuits. The design methodologies rely greatly on the use of cells corresponding to various gates, flip/flops, etc., used within the ASIC. Thus, accurate models of the cells are required to provide accurate integrated circuit designs.

Extensive information regarding these cells is typically required to create accurate cells. This cell information is subsequently used by the following exemplary ASIC design tools including: simulators, timing verifiers, model dumpers, netlisters, synthesis tools, place and route tools, to design the integrated circuit. Such cell information typically includes timing information, capacitance information, power information and geometrical information. The timing information provides pin to pin delays, set-up and hold times, and minimum pulse width of a cell. The capacitance information provides the capacitance values of input/output pins of a cell. This information is used to compute delays using a delay model. With the advent of micron technologies, these delay models are increasingly sophisticated.

Typically there are two types of cells which are modeled. These cells include combinatorial cells and sequential cells. For combinatorial cells there is one type of input pin. Exemplary combinatorial cells include AND gates, OR gates, XOR gates and the like. Sequential cells have a plurality of pins such as data pins, clock pins, clear and preset pins. Exemplary sequential cells include flip/flops, latches and the like.

The pin to pin delay mentioned above is measured from the input pins to the output pins of the cell. The pin to pin delay is generally the time it takes for an input voltage change to cause the change of an output voltage. There can be several types of pin to pin delay depending on the edges of the output and/or the input. The types can be sorted by (rising output delay and falling output delay) or (rising input-rising output delay, rising input-falling output delay, falling input-rising output delay, and falling input-falling output delay). This delay information is extremely useful during the design process to assure proper timing throughout the cell.

One problem encountered in the utilization of conventional ASIC design tools and schemes has been the need for the user to generate stimuli to be applied to the subject cell to measure timing data within a simulator, such as SPICE™. Such prior art devices and techniques involve this additional design step for ASIC formation. There exists a need to provide a ASIC design tool which automatically generates stimuli which is subsequently applied to a simulator to provide a timing characterization of the cell.

BRIEF DESCRIPTION OF THE DRAWINGS

Preferred embodiments of the invention are described below with reference to the following accompanying drawings.

FIG. 10 is a flow chart of an extraction operation performed by the stimuli generator.

FIG. 13 is a diagrammatic representation of stimuli utilized for analyzing CP to Q delay of a D flip/flop.

FIG. 14 is a diagrammatic representation of stimuli utilized for analyzing CP to Q delay of a toggle flip/flop with clear.

FIG. 15 is a diagrammatic representation of stimuli utilized for analyzing CP to Q delay of a toggle flip/flop with preset.

FIG. 16 is a diagrammatic representation of stimuli utilized for analyzing CDN to Q delay of a D flip/flop.

DETAILED DESCRIPTION OF THE PREFERRED EMBODIMENTS

Figure 1:
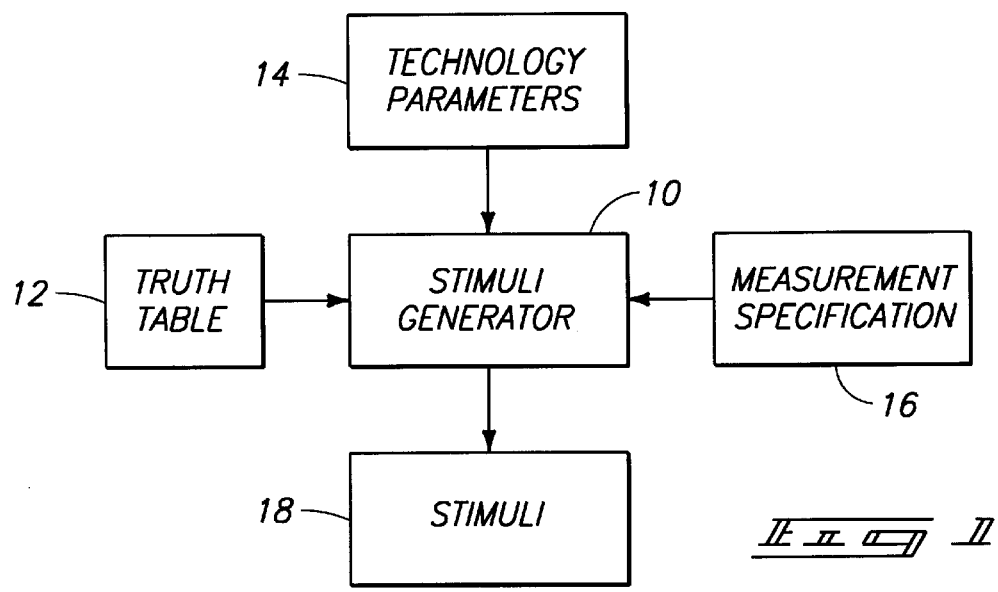
FIG. 1 is a functional block diagram showing the input and output of a stimuli generator according to the present invention.

This disclosure of the invention is submitted in furtherance of the constitutional purposes of the U.S. Patent Laws "to promote the progress of science and useful arts" (Article 1, Section 8).

According to a first aspect of the present invention, a stimuli generator comprises: an interface configured to receive a truth table including a plurality of lines which define the logical behavior of a cell, the truth table comprising stimulus for application to the cell and output information generated by the cell responsive to the applied stimulus; a memory device configured to store operational code; and a processor coupled with the interface and the memory device, the processor being configured via the operational code to extract at least one stimuli for the cell from the truth table, the extracted stimuli being useable to provide a selected delay characterization of the cell.

In accordance with a second aspect of the present invention, methods of analyzing a cell comprise: providing a truth table which includes plural lines defining the logical behavior of a cell, the truth table comprising stimulus for application to the cell and output information generated by the cell responsive to applied stimulus; providing a preselected condition; and selectively extracting at least one stimuli from the truth table responsive to the preselected condition.

Another aspect of the present invention provides methods of generating at least one stimuli for characterizing delay comprising: providing a truth table which includes plural lines defining the logical behavior of a cell, the truth table comprising stimulus for application to the cell and output information generated by the cell responsive to applied stimulus; providing a preselected condition; providing a measurement specification; extracting at least one stimuli from the truth table responsive to the preselected condition and the measurement specification; and following the extracting, converting the at least one stimuli to a corresponding list of points.

Yet another aspect of the present invention provides methods of characterizing delay of a cell comprising: providing a truth table which includes plural lines defining the logical behavior of a cell, the truth table comprising stimulus for application to the cell and output information generated by the cell responsive to applied stimulus; extracting at least one stimuli from the truth table; and generating at least one characterized delay value responsive to the extracting.

The present invention provides an ASIC design tool, also referred to herein as a stimuli generator. The stimuli generator is generally identified herein by reference numeral 10. The present invention also provides methods of analyzing a cell, methods of generating at least one stimuli, and methods of characterizing delay of a cell.

The stimuli generator 10 according to the present invention is configured to generate stimuli from an inputted truth table. In one embodiment, the generated stimuli is utilized to measure delay from an input pin to an output pin of either a combinatorial or sequential cell. As is discussed in detail below, stimuli generator 10 generates a stimulus 0, a stimulus 1 and a stimulus 0, to measure the rise output delay and the fall output delay of a combinatorial cell.

Additionally, the stimuli generator 10 is operable to generate stimuli to measure the delay from a data input to an output of latch cells. Stimuli generator 10 generates a stimulus 0, a stimulus 1 and a stimulus 0 to measure the rise output delay and fall output delay of a latch cell. The stimuli generator 10 also generates stimuli to measure the delay from a clock input to an output of flip/flop latch cells. Stimuli generator 10 generates a stimulus reset, a stimulus 1 and a stimulus 0 to measure the rise output delay and the fall output delay for a flip/flop latch cell.

The stimuli generator 10 generates stimuli to measure the delay from a clear or preset input to an output of flip/flop latch cells. In particular, stimuli generator 10 generates a stimulus reset, a stimulus 1 and a stimulus 0 to measure the rise output delay and the fall output delay. Stimuli generator 10 also generates a stimulus reset and a stimulus "force-to-1" to measure the rise output delay, and a stimulus reset and a stimulus "force-to-0" to measure the fall output delay.

Referring to FIG. 1, stimuli generator 10 is configured to receive a variety of inputs in the described embodiment. In particular, stimuli generator 10 is configured to receive a functional behavior description of a cell. Thereafter, stimuli generator 10 creates stimuli 18 which may be utilized, for example, as input into a circuit simulator such as SPICE™. Thus, the functional behavior of a cell is inputted into stimuli generator 10 which creates the output stimuli 18 utilized for characterizing delay values of the cell. The functional behavior may be described in terms of a truth table 12. Truth table 12 is provided in VITAL format in accordance with one embodiment.

In addition to the insertion of the functional behavior of the cell, technology parameters 14 are also inputted into stimuli generator 10. Technology parameters 14 include $V_{SS}$ (i.e., the voltage of a logic 0 value), $V_{DD}$ (i.e., the voltage of a logic 1 value), rise time (i.e., the time for a signal to go from $V_{SS}$ to $V_{DD}$), fall time (i.e., the time for a signal to go from $V_{DD}$ to $V_{SS}$) and the bit-cycle (i.e., the duration of the voltage value that is set on an input pin of the circuit or cell).

As shown in FIG. 1, a measurement specification 16 is also applied to stimuli generator 10 in the described embodiment. Measurement specification 16 specifies the desired input and output pins intermediate which delay is to be measured. From the inputted functional behavior, technology parameters and measurement specification, stimuli generator 10 outputs stimuli 18.

Figure 2:
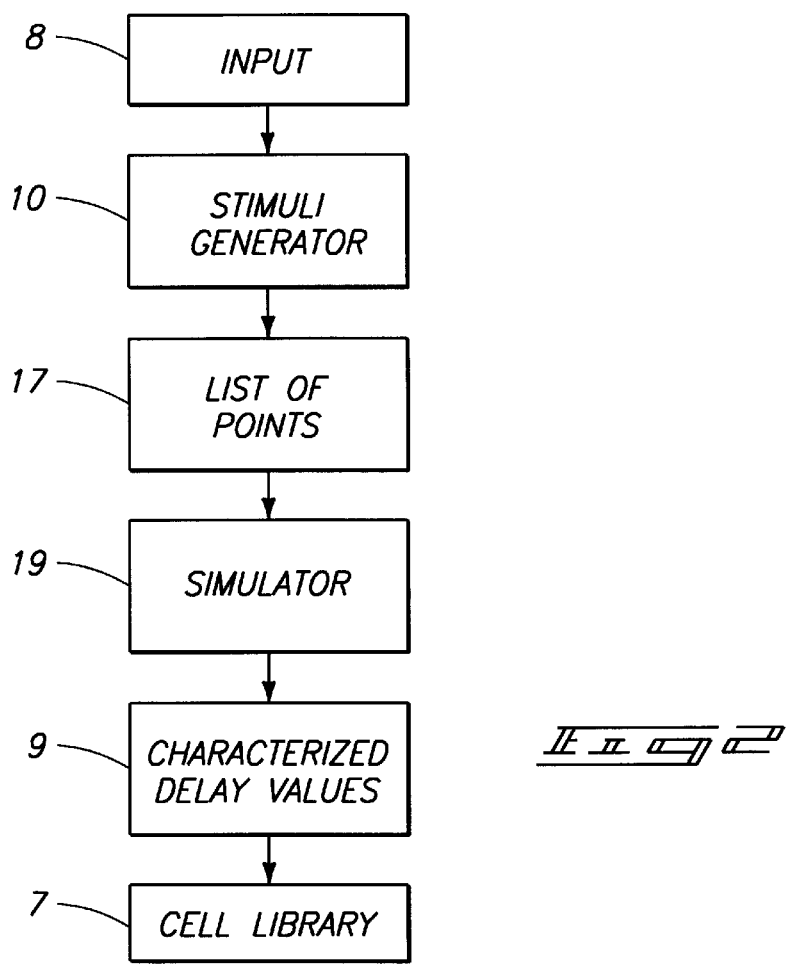
FIG. 2 is a diagrammatic illustration representing the characterization of delay of a cell.

Referring to FIG. 2, the utilization of stimuli generator 10 of the present invention in a process of characterizing the timing or delay values of a cell is described. Input 8, including a truth table representing the logic behavior of the cell to be characterized, and the aforementioned technology parameters and measurement specification are provided to stimuli generator 10.

Using methods of the present invention, stimuli generator 10 creates stimulus which may be subsequently used to characterize specified delay (e.g., pin to pin delay) of the cell. The generated stimulus is outputted in the form of a list of points 17 (e.g., time and voltage). In one embodiment, list of points 17 is provided as a SPICE™ deck file. The list of points 17 is the definition of the PWL voltage source applied on the input pins of the cell. The list of points 17 is applied to a simulator 19 such as SPICE™. The simulator 19 creates characterized delay values 9 of the cell based upon the list of points stimulus generated by stimuli generator 10. The characterized delay data or values 9 may be subsequently stored in a cell library 7 for use by an integrated circuit or ASIC design tool.

Figure 3:
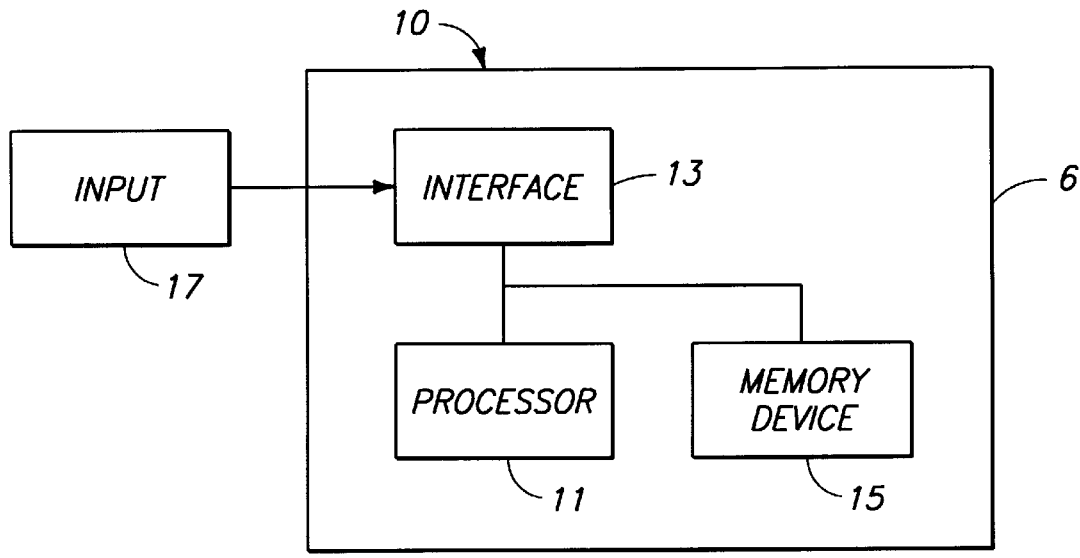
FIG. 3 is a functional block diagram of one embodiment of the stimuli generator.

Referring to FIG. 3, one embodiment of stimuli generator 10 is shown. The depicted stimuli generator 10 is implemented within a digital computer 6. Stimuli generator 10 generally comprises a processor 11, interface 13 and memory device 15. Other configurations of stimuli generator 10 are possible.

Processor 11 comprises a conventional processor which is configured via operational code to generate stimuli for providing pin to pin delay measurements and timing characterization of a cell. A truth table representing the logical behavior of the cell may be inputted as input 8 to interface 13 of stimuli generator 10. Further, measurement specifications and technology parameters are provided as input 8 received at interface 13. The operational code, preferably provided in C++ language, is stored in memory device 15. Exemplary memory devices include ROM-integrated circuits or a hard disk drive.

The stimulus of a cell is generally the values that are applied on the input pins of the cell. The stimulus can be seen as a set of logical values (i.e., 0 or 1) or a list of points (i.e., time and voltages). For example, one stimuli for a dual input AND cell is:

A->0 1 0
B->1 1 1 where A is a first input of the AND cell and B is a second input of the AND cell.

Figure 4:
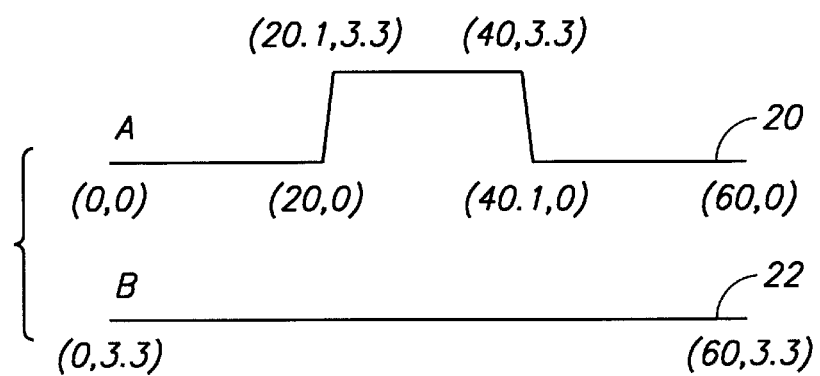
FIG. 4 is a diagrammatic representation of an exemplary stimuli applied to an AND cell.

Referring to FIG. 4, the set of logical values provided above are transformed to a list of points and illustrated as input voltage waveforms for the AND cell. With the technology parameters $V_{SS}$=0 volts, $V_{DD}$=3.3 volts, rise time= 0.1 ns, fall time=0.1 ns, and bit cycle=20 ns, the list of points is:

| | | |
|---|---|---|
| A | -> | (0.0ns, 0V) (20.0ns, 0V) (20.1ns, 3.3V) (40.0ns, 3.3V) (40.1ns, 0V) (60.0ns, 0V) |
| B | -> | (0.0ns, 3.3V) (60.0ns, 3.3V) |

The input waveform to the first input (pin A) of the AND cell is shown as line 20, and the input waveform to the second input (pin B) of the AND cell is shown as line 22. As shown in the figure, the voltage of the signal applied to input pin A from time t=0–20 ns is 0 Volts. From time=20.1 ns–40 ns, the voltage applied to input pin A as shown by line 20, is 3.3 Volts. The voltage applied to input pin A is 0 Volts from time t=40.1 ns–60 ns. The voltage of the signal applied to input pin B from time t=0–60 ns is 3.3 volts, as shown by line 22.

The measurement specification 16 supplies the pins wherein delay measurement is to be taken. Pin to pin delay is typically measured between trip points of the input pin and output pin. A trip point is the point of time (i.e., time, voltage) when the voltage of a pin crosses a certain value. The input and output trip points that are taken for the measurement depend on a timing model chosen by the user. The delay measurements are used by digital simulator and timing analyzer tools to determine the timing behavior of the circuit design.

The particular method of characterizing the pin to pin delay depends on the type of cell (e.g., combinatorial, sequential) and the type of input pins (e.g., clock, data, preset, clear) of the cell. A measurement method for obtaining input to output delay in a combinatorial cell is described with reference to FIG. 5. Measurement methods for obtaining input to output delays in a sequential cell are described with reference to FIG. 6–FIG. 9.

Figure 5:
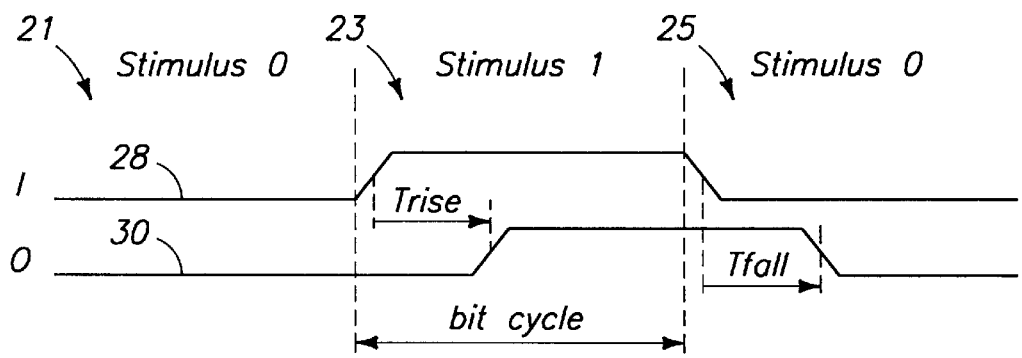
FIG. 5 is a diagrammatic representation of waveforms of input and output voltages of a combinatorial cell.

Referring to FIG. 5, waveforms of the input voltage signal and output voltage signal of a combinatorial cell are shown. In particular, the input voltage signal is shown as line 28, and the output voltage is shown as line 30. The input voltage waveform 28 is divided into three equal parts individually referred to as bit cycles 21, 23, 25. During the first bit cycle 21, the stimuli that is applied on the input pin of the cell is a "stimulus 0". Stimulus 0 causes the output of the cell to go to a logic low voltage (i.e., $V_{SS}$ voltage at the output). During the second bit cycle 23, the applied stimuli is a "stimulus 1" or the stimulus that causes the output of the cell to go to a logic high voltage (i.e., $V_{DD}$ voltage at the output). On the third bit cycle 25, the applied stimuli is again stimulus 0. The pin to pin delay is determined by applying stimulus 0, stimulus 1 and stimulus 0 to the input pins of the cell.

The output rising delay is measured during the second bit cycle 23, and the output falling delay is measured during the third bit cycle 25. In particular, the output rising delay ($T_{rise}$) is measured from the trip point of the rising input signal, as shown by line 28, to the trip point of the output voltage signal, represented by line 30, as the output voltage signal rises responsive to the input voltage signal. The output falling delay ($T_{fall}$) is measured from the trip point of the input falling voltage signal 28 to the trip point of the falling output voltage signal 30.

There are typically three measurements when sequential cells are concerned. The first measurement is the data input to output delay (i.e., D to Q delay). This delay exists for latch cells when the clock of the latch is active such that the latch is transparent. This measurement is the same as the input to output delay measurement for combinatorial cells described with reference to FIG. 5.

Figure 6:
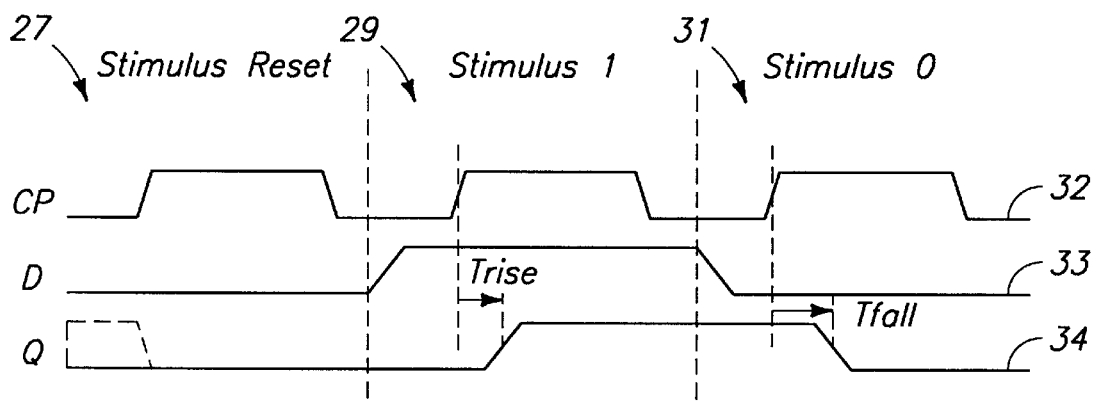
FIG. 6 is a diagrammatic representation of waveforms of input and output voltages of a sequential flip/flop cell.
Figure 7:
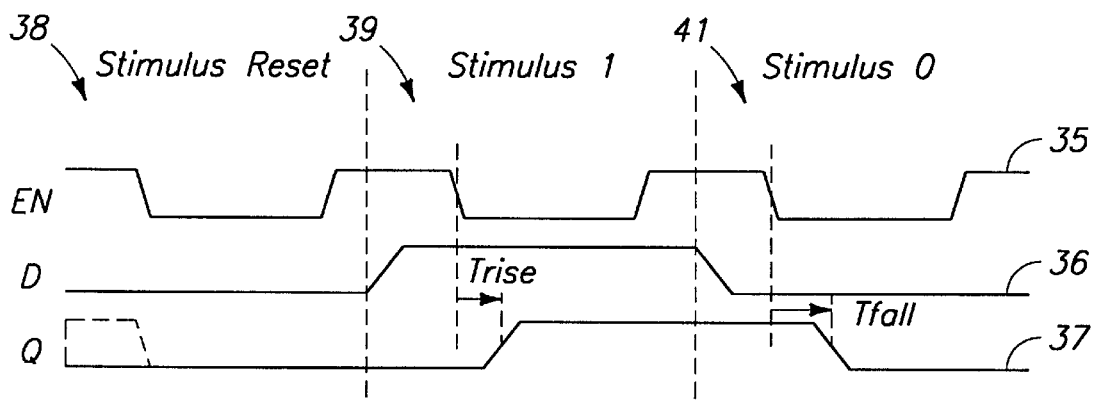
FIG. 7 is a diagrammatic representation of waveforms of input and output voltages of a sequential latch cell.

Referring to FIG. 6 and FIG. 7, the second measurement in sequential cells is the clock input to output delay (e.g., CP to Q delay). Waveforms of a flip/flop cell and latch cell are shown in FIG. 6 and FIG. 7, respectively. The input waveforms for the individual cells are divided into three bit cycles. In particular, waveforms are inputted into the flip/flop cell during a first bit cycle 27, second bit cycle 29 and third bit cycle 31. Waveforms are inputted into the latch cell during a first bit cycle 38, second bit cycle 39 and third bit cycle 41.

Referring to FIG. 6, a clock waveform, data input waveform and data output waveform are shown. The clock waveform (CP) is represented by line 32, the inputted data (D) is represented by line 33, and the output (Q) is represented by line 34. Referring to FIG. 7, the latch enable signal (EN) is represented by line 35, the data input waveform (D) is represented by line 36, and the data output (Q) is represented by line 38.

Referring to FIG. 6 and FIG. 7, the applied stimulus is "stimulus reset" during the respective first bit cycles 27, 38. Stimulus reset provides a logic low voltage signal at the output of the cells, as represented by respective lines 34 and line 37. During the respective second bit cycles 29, 39, the applied stimulus is stimulus 1. Stimulus 1 causes the output data to go to a logic level high voltage, as shown by respective lines 34, 37. On the respective third bit cycles 31, 41, the applied stimulus is "stimulus 0". Stimulus 0 causes the output of the flip/flop and latch to go to a logic level low voltage, as represented by respective lines 34, 37. Similar to the combinatorial cell, delay is measured in the second bit cycle ($T_{rise}$ or output rising delay) and in the third bit cycle ($T_{fall}$ or output falling delay). In particular, times $T_{rise}$ and $T_{fall}$ for both the flip/flop cell and latch cell are measured during the second and third bit cycles, respectively.

Figure 8:
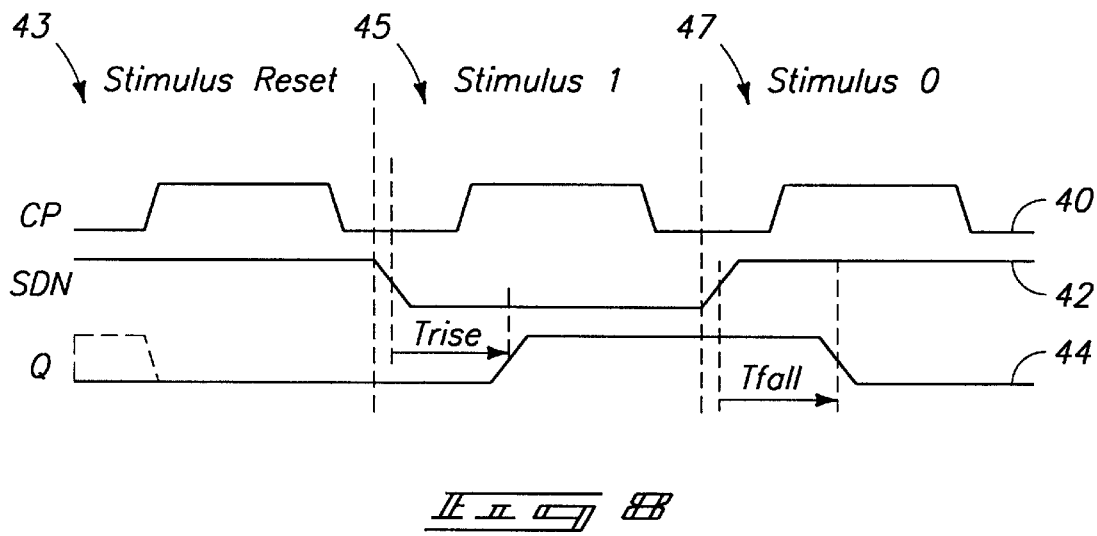
FIG. 8 is a diagrammatic representation of waveforms of input and output voltages illustrating rise/fall output for sequential cells.
Figure 9:
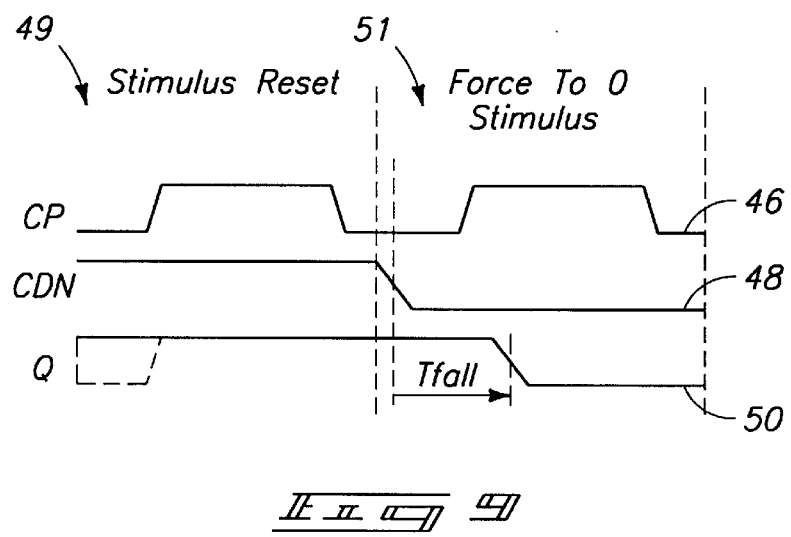
FIG. 9 is a diagrammatic representation of waveforms of input and output voltages illustrating fall output for sequential cells.

Referring to FIG. 8 and FIG. 9, waveform diagrams for determining preset and clear input to output delays for sequential toggle flip/flop cells are shown. Waveforms for determining the clock (CP) to output (Q) delay for a toggle flip/flop with preset are shown in FIG. 8. Waveforms for determining the clear (CDN) to output (Q) delay are shown in FIG. 9. The waveforms described below for the preset and clear input pins are a mix of previously described waveforms.

Referring to FIG. 8, the waveforms inputted into a toggle flip/flop cell with preset input pin individually comprise a first bit cycle 43, second bit cycle 45 and third bit cycle 47. Referring to FIG. 9, the waveforms inputted into the toggle flip/flop cell with clear input pin comprise a first bit cycle 49 and second bit cycle 51.

Referring again to FIG. 8, a clock pulse waveform applied to the cell is represented by line 40. A preset input waveform is represented by line 42. An output waveform from the cell is represented by line 44. In the case where there is a rising output delay (as shown in FIG. 8), the stimulus are stimulus reset during the first bit cycle 43 and stimulus 1 during the second bit cycle 45. Stimulus 0 is provided to the cell in the third bit cycle 47 as shown.

Referring again to FIG. 9, a clock pulse waveform applied to the cell is represented by line 46. A clear input waveform is represented by line 48, and an output waveform from the cell is represented by line 50. In the case where there is a falling output delay (as shown in FIG. 9), the corresponding stimulus comprise a stimulus reset during the first bit cycle 49 and a "force to zero" stimulus during the second bit cycle 51. The illustrated delay is for output falling to logic level low ($T_{fall}$) responsive to the force to zero stimulus. Not all input waveforms for the preset and clear pins provide both rising and falling delays.

Alternatively, the stimulus comprises a stimulus reset and a "force to one" stimulus corresponding to respective bit cycles 49, 51 in the case where a rising output delay ($T_{rise}$) is desired.

The above illustrates various pin to pin delays within certain cells. Stimuli generator 10 is configured to search for stimulus that may be applied to a simulator to provide timing characterizations of the cell. Such searching of stimulus by stimuli generator 10 in accordance with one embodiment of the present invention is described below.

Stimuli generator 10 is configured to search the provided or inputted truth table 12 for stimulus. Stimuli generator 10 searches a list of duplets (stimulus 0, stimulus 1) for combinatorial cells and triplets (stimulus reset, stimulus 0, stimulus 1) for sequential cells. There are several delay measurements that can be considered depending on the type of the input. Various input includes input pins of combinatorial cells and the edge clock of flip/flop cells, the level clock of latches, and the preset/clear pins of sequential cells.

In the described embodiment of the invention, stimuli extraction operations performed by stimuli generator 10 comprise a plurality of phases for both combinatorial and sequential cells. Such stimuli extraction operations extract stimuli from the inputted truth table according to the inputted measurement specification. The extracted stimuli or stimulus may be subsequently utilized to provide a timing characterization of the subject cell being analyzed.

The stimulus extraction operations for combinatorial cells are discussed hereafter with reference to the flow chart of FIG. 10 and Table 1 and Table 2. Processor 11 of stimuli generator 10 is configured via operational code to implement the extraction operations.

Referring specifically to FIG. 10, the first phase of extraction for the analysis of combinatorial cells by stimuli generator 10 provides expanding the inputted truth table 12 by replacing any existing "don't care" or "-" symbols by 0 and 1 at step 58. The first phase of extraction provides an expanded truth table which is the logic behavioral equivalent of the inputted truth table 12.

For example, Table 1 shows an exemplary inputted truth table for an AND cell.

TABLE 1

| AB | Z |
|---|---|
| 0- | 0 |
| 10 | 0 |
| 11 | 1 |

Following manipulation by processor 11 of stimuli generator 10 in accordance with phase one of the described extraction method of the present invention, the inputted truth table is expanded to the behavioral equivalent shown in Table 2.

TABLE 2

| Line | AB | Z |
|---|---|---|
| 1 | 00 | 0 |
| 2 | 01 | 0 |
| 3 | 10 | 0 |
| 4 | 11 | 1 |

Referring again to FIG. 10, processor 11 of stimuli generator 10 proceeds to phase two of the extraction method at step 59. During phase two processor 11 searches the expanded truth table for lines which satisfy preselected conditions described below. In particular, during the second phase, the lines of the expanded truth table for an AND cell (i.e., combinatorial cell) are analyzed.

Figures 11, 12:
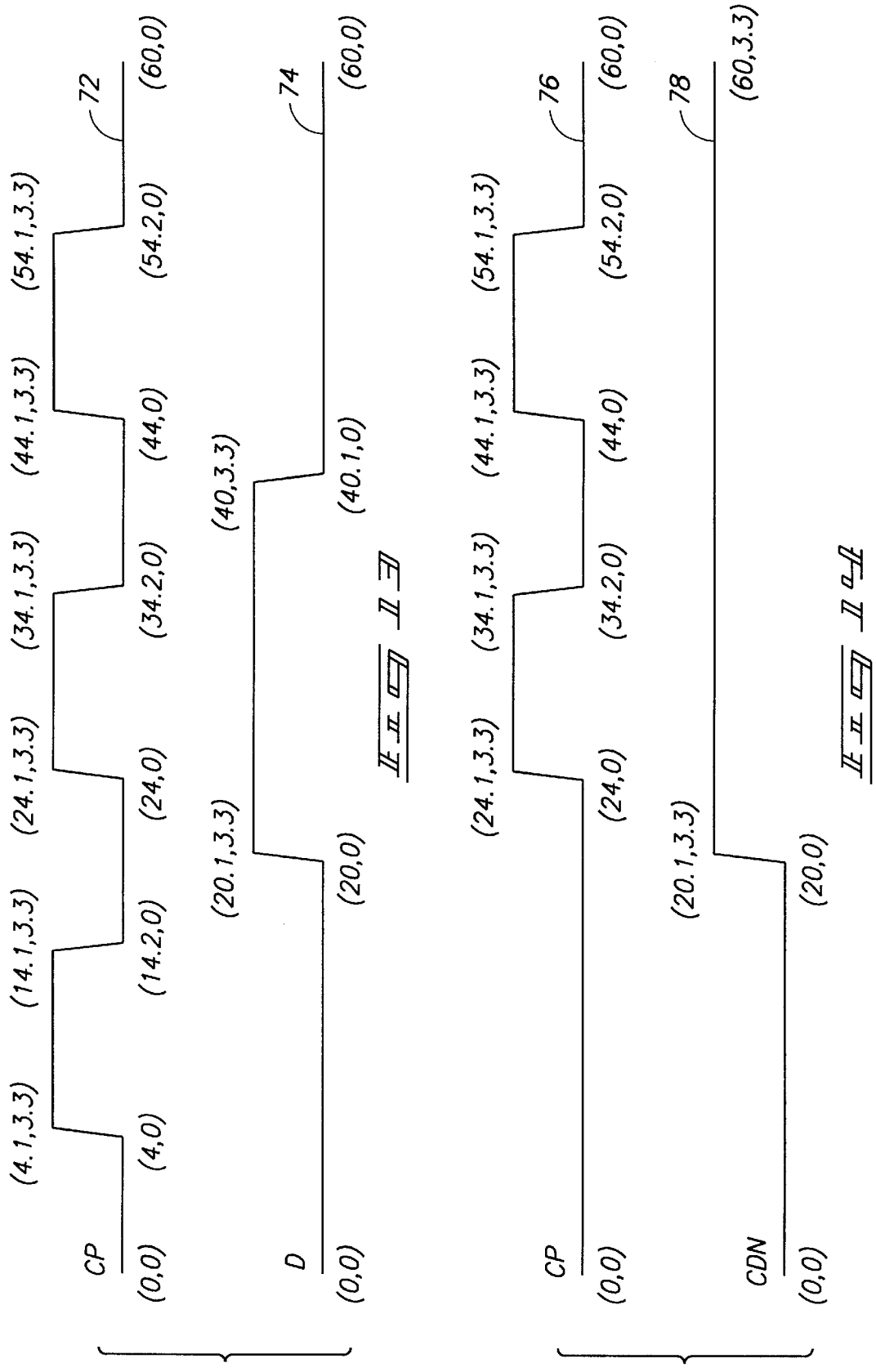
FIG. 11 is a flow chart of a method for searching stimulus for a combinatorial cell.
FIG. 12 is a diagrammatic representation of a transformation of logic behavioral stimulus to a list of points stimulus.

Referring to FIG. 11, one method of searching the inputted and expanded truth table of a combinatorial cell is discussed. The discussion herein provides stimulus enabling measurement of the delay from input pin A to output pin Z. Processor 11 is configured via operational code to perform the searching to determine which lines satisfy preselected conditions. In particular, at step 52, a line of the expanded truth table is read by processor 11. Next, it is determined whether a measured input pin value (e.g., pin A of the AND cell) of the line is equal to zero at step 53. If the input pin of the current line is not equal to zero, processor 11 of stimuli generator 10 proceeds to step 54 where the selected line is incremented and the next line is read at step 52. If the input pin of the line being read is equal to zero, processor 11 proceeds to step 55 where adjacent stimulus is searched.

Adjacent stimulus is defined herein with respect to combinatorial cells as the stimulus that has the same values for all the input pins except for the measured input pin (e.g., pin A of the AND cell) which should be opposite that of the current line being searched (i.e., the selected line). Once adjacent stimulus is searched, processor 11 next proceeds to step 56 where the output values of the selected line and the adjacent line are analyzed. If the values of the measured output pin for both lines are equal, then the lines are rejected and processor 11 proceeds to step 54 and step 52 to read the next line. If the output values of the selected and adjacent lines are different as determined at step 56, then at step 57, processor 11 has found stimulus 0 and stimulus 1 for the combinatorial (e.g., AND) cell. The particular line of the selected line and adjacent line which provides the output value to zero gives the stimulus 0. Likewise, the particular line of the selected line and adjacent line which provides the output value of cell to one gives the stimulus 1 for the cell.

Referring to Table 2, all lines of the expanded truth table are searched. Beginning with line 1, the input value is 0 and, in accordance with the above, the adjacent stimulus is that of line 3. The output values of line 1 and line 3 are equal (i.e., zero) and therefore, line 1 is rejected. Proceeding to searching line 2, the input pin value is 0 and the adjacent stimulus is line 4. The output values of line 2 and line 4 are opposite. Line 2 provides a zero output value and thus, line 2 provides the stimulus 0 (AB=01). Line 4 provides a high or one output value and thus, line 4 gives stimulus 1 (AB=11).

Proceeding to line 3 of the expanded truth table, the input pin value (e.g., pin A of the AND cell) is 1 and therefore, line 3 is rejected. Similar to the analysis of line 3, line 4 of the expanded truth table is rejected because the input pin value is 1.

The result of phase two of the extraction procedure yields a list of duplets (stimulus 0, stimulus 1) which satisfy the preselected conditions. The duplets (stimulus 0, stimulus 1) in the described example for the AND cell are (01, 11), respectively.

Referring again to FIG. 4, phase three of the stimuli extraction operations of stimuli generator 10 is described with respect to a combinatorial AND cell. In accordance with the extraction method illustrated in FIG. 10, phase three of the stimuli extraction for combinatorial cells converts the searched duplets into a list of points comprising respective times and voltages. The conversion of the searched stimuli to the time and voltages provides a list of points stimuli which enables determination of the delay from input pin A to output pin Z. The duplet stimuli for a combinatorial AND cell is converted using the inputted or otherwise provided technology parameters. Exemplary technology parameters are: $V_{SS}$=0V, $V_{DD}$=3.3V, rise time=0.1 ns, fall time=0.1 ns, and bit cycle=20 ns.

The respective list of points is illustrated as lines 20, 22 of FIG. 4. Line 20 represents the input voltages and timing for input pin A, and line 22 represents the input voltages and timing for line B. The lines are divided into three bit cycles from time t=0–20 ns, t=20.1 ns–40 ns and t=40.1 ns–60 ns. According to the waveforms described with reference to FIG. 5, stimulus 0 is applied during the first and third bit cycles, and stimulus 1 is applied during the second bit cycle.

As shown, from time t=0–20 ns, the input voltage applied to pin A is 0 volts. From time t=20.1 ns–40 ns, the input voltage at pin A is 3.3 volts. From time t=40.1 ns–60 ns, the voltage at pin A of the AND cell is 0 volts. The input voltage at pin B, represented by line 22, is 3.3 volts from time t=0–60 ns.

Stimuli generator 10 is also configured to generate stimulus for sequential cells. With sequential cells, delay may be measured from the data input to the output (e.g., D to Q delay), from the clock input to the output (e.g., CP to Q delay), and the clear and preset input to the output (e.g., CP to Q delay for a toggle flip/flop with clear, CP to Q delay for a toggle flip/flop with preset, CDN to Q delay). Similar to the extraction for combinatorial cells, the stimuli extraction for sequential cells comprises a plurality of phases in one embodiment of the invention. Such phases correspond to the flow chart shown in FIG. 10.

The stimuli extraction for providing stimuli for measuring the delay from the clock to the output of a sequential cell is described below. Phase one of the clock to output sequential cell stimuli extraction is to fully expand a provided truth table by replacing any existing "don't care" symbols by zeros and ones. Referring to Table 3, the provided truth table for a D flip/flop for determining the delay from CP to Q is shown.

TABLE 3

| CDN | CP | D | S | S | Q | QN |
|---|---|---|---|---|---|---|
| 0 | — | — | — | 0 | 0 | 1 |
| 1 | 0 | — | 0 | 0 | 0 | 1 |
| 1 | 0 | — | 1 | 1 | 1 | 0 |
| 1 | 1 | — | 0 | 0 | 0 | 1 |
| 1 | 1 | — | 1 | 1 | 1 | 0 |
| 1 | / | 0 | — | 0 | 0 | 1 |
| 1 | / | 1 | — | 1 | 1 | 0 |

During phase one of the stimuli extraction, the provided truth table is expanded to the behavioral equivalent truth table shown in Table 4.

TABLE 4

| Line | CDN | CP | D | S | S | Q | QN |
|---|---|---|---|---|---|---|---|
| 1 | 0 | 0 | 0 | 0 | 0 | 0 | 1 |
| 2 | 0 | 0 | 0 | 1 | 0 | 0 | 1 |
| 3 | 0 | 0 | 1 | 0 | 0 | 0 | 1 |
| 4 | 0 | 0 | 1 | 1 | 0 | 0 | 1 |
| 5 | 0 | 1 | 0 | 0 | 0 | 0 | 1 |
| 6 | 0 | 1 | 0 | 1 | 0 | 0 | 1 |
| 7 | 0 | 1 | 1 | 0 | 0 | 0 | 1 |
| 8 | 0 | 1 | 1 | 1 | 0 | 0 | 1 |
| 9 | 1 | 0 | 0 | 0 | 0 | 0 | 1 |
| 10 | 1 | 0 | 0 | 1 | 1 | 1 | 0 |
| 11 | 1 | 0 | 1 | 0 | 0 | 0 | 1 |
| 12 | 1 | 0 | 1 | 1 | 1 | 1 | 0 |
| 13 | 1 | 1 | 0 | 0 | 0 | 0 | 1 |
| 14 | 1 | 1 | 0 | 1 | 1 | 1 | 0 |
| 15 | 1 | 1 | 1 | 0 | 0 | 0 | 1 |
| 16 | 1 | 1 | 1 | 1 | 1 | 1 | 0 |
| 17 | 1 | / | 0 | 0 | 0 | 0 | 1 |
| 18 | 1 | / | 0 | 1 | 0 | 0 | 1 |
| 19 | 1 | / | 1 | 0 | 1 | 1 | 0 |
| 20 | 1 | / | 1 | 1 | 1 | 1 | 0 |

During phase two of the extraction for sequential cells, the lines of the expanded truth table are searched according to the preselected conditions. In particular, the lines are sorted by the different values of the preset (SDN) and clear (CDN) pins in accordance with one embodiment. Following the sorting, there are $2^n$ lists of lines where n is the number of preset and clear pins.

In the D flip/flop example, the lines of the expanded truth table are sorted for CDN=0 and CDN=1 in the presently described embodiment. Such sorting provides the truth table lines into "active" lists and one "inactive" list. For each of the active values of the preset/clear pins, the output is constant. The list of lines where the output is not constant is considered as the "inactive" list. The "active" list (CDN=0) of the expanded truth table for the D flip/flop is shown in Table 5. The "inactive" list (CDN=1) of the expanded truth table is shown in Table 6.

TABLE 5

| CDN | CP | D | S | S | Q | QN |
|---|---|---|---|---|---|---|
| 0 | 0 | 0 | 0 | 0 | 0 | 1 |
| 0 | 0 | 0 | 1 | 0 | 0 | 1 |
| 0 | 0 | 1 | 0 | 0 | 0 | 1 |
| 0 | 0 | 1 | 1 | 0 | 0 | 1 |
| 0 | 1 | 0 | 0 | 0 | 0 | 1 |
| 0 | 1 | 0 | 1 | 0 | 0 | 1 |
| 0 | 1 | 1 | 0 | 0 | 0 | 1 |
| 0 | 1 | 1 | 1 | 0 | 0 | 1 |

TABLE 6

| Line | CDN | CP | D | S | S | Q | QN |
|---|---|---|---|---|---|---|---|
| 1 | 1 | 0 | 0 | 0 | 0 | 0 | 1 |
| 2 | 1 | 0 | 0 | 1 | 1 | 1 | 0 |
| 3 | 1 | 0 | 1 | 0 | 0 | 0 | 1 |
| 4 | 1 | 0 | 1 | 1 | 1 | 1 | 0 |
| 5 | 1 | 1 | 0 | 0 | 0 | 0 | 1 |
| 6 | 1 | 1 | 0 | 1 | 1 | 1 | 0 |
| 7 | 1 | 1 | 1 | 0 | 0 | 0 | 1 |
| 8 | 1 | 1 | 1 | 1 | 1 | 1 | 0 |
| 9 | 1 | / | 0 | 0 | 0 | 0 | 1 |
| 10 | 1 | / | 0 | 1 | 0 | 0 | 1 |
| 11 | 1 | / | 1 | 0 | 1 | 1 | 0 |
| 12 | 1 | / | 1 | 1 | 1 | 1 | 0 |

The "active" lists are rejected in the stimuli extraction since the changing of the state of the clock does not change the output of the cell. The lines of the "inactive" list are read one by one by stimuli generator 10. A line is rejected if the state does not change or the clock pin value is not an active clock value (i.e., / or \ for an edge clock, or 0 or 1 for level clock).

In the D flip/flop example, lines 10 and 11 of Table 6 match the previous condition:

line 10: 1/01 001: clock value is / and state goes from 1 to 0.

line 11: 1/10 110: clock value is / and state goes from 0 to 1.

In particular, in line 10 the clock value is a rising edge and the state goes from 1 to 0. For line 11, the clock value is also a rising edge and the state goes from 0 to 1. Then with the stimulus (stimulus_j) that is in the line, we search in the inactive list a stimulus (stimulus_k) that has an edge value on the clock pin and that matches the following preselected condition:

stimulus_j state_x=>state_y out_j stimulus_k state_y=>state_x out_k with out_j different from out_k When the stimulus_j and stimulus_k are found, then stimuli generator 10 searches the stimulus 0 between stimulus_j and stimulus_k. In the D flip/flop example, the following lines match the previous conditions:

line 10: stimulus_j=1 / 0 state_x=1=>state_y=0 out_j=0 line 11: stimulus_k=1 / 1 state_y=0=>state_x=1 out_k=1=>stimulus 0=1 / 0 stimulus 1=1 / 1 line 11: stimulus_j=1 / 0 state_x=0=>state_y=1 out_j=1 line 10: stimulus_k=1 / 1 state_y=1=>state_x=0 out_k=0=>stimulus 0=1 / 0 stimulus 1=1 / 1 (rejected because of redundancy)

Next, stimuli generator 10 determines whether the found stimulus is "ambiguous". According to the expanded truth table, a stimulus is ambiguous if the output value, when applying the stimulus, depends on the internal state of the cell. If the stimulus 0 is not ambiguous, then the stimulus reset will be equal to this identified stimulus 0. In the example of the D flip/flop cell, the stimulus 0 (1 / 0) always gives the same output (0 0 1) for all states (line 10 and line 11 of the expanded truth table of Table 6).

If the stimulus 0 is ambiguous, then the stimulus reset may be searched in the following examples of a toggle flip/flop with a clear pin (CDN) and a toggle flip/flop with a preset pin (SDN). An inputted or otherwise provided truth table for the toggle flip/flop with a clear pin is shown in Table 7 and the provided truth table is expanded to the truth table shown in Table 8.

TABLE 7

| CDN | CP | S | S | Q | QN |
|---|---|---|---|---|---|
| 0 | — | — | 0 | 0 | 1 |
| 1 | 0 | 0 | 0 | 0 | 1 |
| 1 | 0 | 1 | 1 | 1 | 0 |
| 1 | 1 | 0 | 0 | 0 | 1 |
| 1 | 1 | 1 | 1 | 1 | 0 |
| 1 | / | 0 | 1 | 1 | 0 |
| 1 | / | 1 | 0 | 0 | 1 |

TABLE 8

| CDN | CP | S | S | Q | QN |
|---|---|---|---|---|---|
| 0 | 0 | 0 | 0 | 0 | 1 |
| 0 | 0 | 1 | 0 | 0 | 1 |
| 0 | 1 | 0 | 0 | 0 | 1 |
| 0 | 1 | 1 | 0 | 0 | 1 |
| 1 | 0 | 0 | 0 | 0 | 1 |
| 1 | 0 | 1 | 1 | 1 | 0 |
| 1 | 1 | 0 | 0 | 0 | 1 |
| 1 | 1 | 1 | 1 | 1 | 0 |
| 1 | / | 0 | 1 | 1 | 0 |
| 1 | / | 1 | 0 | 0 | 1 |

In accordance with the described extraction method, the expanded truth table is sorted into active (CDN=0) and inactive (CDN=1) lists. The active list is shown in Table 9 and the inactive list is shown in Table 10.

TABLE 9

| Line | CDN | CP | S | S | Q | QN |
|---|---|---|---|---|---|---|
| 1 | 0 | 0 | 0 | 0 | 0 | 1 |
| 2 | 0 | 0 | 1 | 0 | 0 | 1 |
| 3 | 0 | 1 | 0 | 0 | 0 | 1 |
| 4 | 0 | 1 | 1 | 0 | 0 | 1 |

TABLE 10

| Line | CDN | CP | S | S | Q | QN |
|---|---|---|---|---|---|---|
| 1 | 1 | 0 | 0 | 0 | 0 | 1 |
| 2 | 1 | 0 | 1 | 1 | 1 | 0 |
| 3 | 1 | 1 | 0 | 0 | 0 | 1 |
| 4 | 1 | 1 | 1 | 1 | 1 | 0 |
| 5 | 1 | / | 0 | 1 | 1 | 0 |
| 6 | 1 | / | 1 | 0 | 0 | 1 |

A provided truth table for the toggle flip/flop with a preset pin (SDN) is shown in Table 11. The provided truth table is expanded to the truth table shown in Table 12.

TABLE 11

| SDN | CP | S | S | Q | QN |
|---|---|---|---|---|---|
| 0 | — | — | 1 | 1 | 0 |
| 1 | 0 | 0 | 0 | 0 | 1 |
| 1 | 0 | 1 | 1 | 1 | 0 |
| 1 | 1 | 0 | 0 | 0 | 1 |
| 1 | 1 | 1 | 1 | 1 | 0 |
| 1 | / | 0 | 1 | 1 | 0 |
| 1 | / | 1 | 0 | 0 | 1 |

TABLE 12

| SDN | CP | S | S | Q | QN |
|---|---|---|---|---|---|
| 0 | 0 | 0 | 1 | 1 | 0 |
| 0 | 0 | 1 | 1 | 1 | 0 |
| 0 | 1 | 0 | 1 | 1 | 0 |
| 0 | 1 | 1 | 1 | 1 | 0 |
| 1 | 0 | 0 | 0 | 0 | 1 |
| 1 | 0 | 1 | 1 | 1 | 0 |
| 1 | 1 | 0 | 0 | 0 | 1 |
| 1 | 1 | 1 | 1 | 1 | 0 |
| 1 | / | 0 | 1 | 1 | 0 |
| 1 | / | 1 | 0 | 0 | 1 |

In accordance with the described extraction method and similar to the above, the expanded truth table is sorted into "active" (SDN=0) and "inactive" (SDN=1) lists. The active list is shown in Table 13 and the inactive list is shown in Table 14.

TABLE 13

| Line | SDN | CP | S | S | Q | QN |
|---|---|---|---|---|---|---|
| 1 | 0 | 0 | 0 | 1 | 1 | 0 |
| 2 | 0 | 0 | 1 | 1 | 1 | 0 |
| 3 | 0 | 1 | 0 | 1 | 1 | 0 |
| 4 | 0 | 1 | 1 | 1 | 1 | 0 |

TABLE 14

| Line | SDN | CP | S | S | Q | QN |
|---|---|---|---|---|---|---|
| 1 | 1 | 0 | 0 | 0 | 0 | 1 |
| 2 | 1 | 0 | 1 | 1 | 1 | 0 |
| 3 | 1 | 1 | 0 | 0 | 0 | 1 |
| 4 | 1 | 1 | 1 | 1 | 1 | 0 |
| 5 | 1 | / | 0 | 1 | 1 | 0 |
| 6 | 1 | / | 1 | 0 | 0 | 1 |

For both toggle flip/flops, lines 5 and 6 of the respective "inactive" lists (i.e., Table 10 and Table 14) have an edge value (/) for the clock and the state changes. Next, the stimulus_j and stimulus_k search provides:

line 5: stimulus_j=1 / state_x=0=>state_y=1 out_j=1
line 6: stimulus_k=1 / state_y=1=>state_x=0 out_k= 0==>stimulus 0=1/ stimulus 1=1/
line 6: stimulus_j=1 / state_x=1=>state_y=0 out_j=0
line 5: stimulus_k=1 / state_y=0=>state_x=1 out_k= 1==>stimulus 0=1 / stimulus 1=1/ (rejected because of redundancy)

From the above, it is apparent that stimulus 0 is ambiguous since stimulus 0 is equal to stimulus 1. Therefore, the stimulus reset may be determined by analysis of lines with respect to the following preselected conditions. First, the stimulus reset is searched in the active list. The stimulus reset should not be ambiguous and should set the cell into a state that yields, with an input of stimulus 1, a logic high on the output.

In the case of plural preset and clear pins, stimulus that have more than one of these pins active are rejected. In the toggle flip/flop with clear example, a stimulus that sets the cell to state 0, without any ambiguity, is searched. The stimulus CDN=0, CP=0 for the toggle flip/flop with clear is not ambiguous and always sets the cell to state 0. CDN=0, CP=0 is the stimulus reset for the toggle flip/flop with clear. This stimulus is preferred to CDN=0, CP=1 because the clock CP is active on a positive edge. The stimulus CDN=0, CP=1 is preferred if the clock is active on the negative edge. If the stimulus is not found, then the stimulus reset is searched in the active list. It should not be ambiguous and should always set the cell into a state that gives, with the stimulus 0, a low on the output.

In the toggle flip/flop with preset example, lines are searched with respect to the following preselected conditions. In particular, stimulus that sets the cell to state 1 without any ambiguity are searched. The stimuli CDN=0, CP=0 is not ambiguous and always sets the cell to the state 1. For the same reason as set forth previously, the stimuli CDN=0, CP=0 is preferred and is the stimulus reset for the toggle flip/flop with preset.

The number of bit cycles of the found stimulus reset for the toggle flip/flop with preset is next preferably reduced. More specifically, the found stimulus is merged to provide the stimulus reset according to the following merge table:

| Merge Table | | |
|---|---|---|
| 00 | --> | 0 value |
| 11 | --> | 1 value |
| 0/ | --> | / value |
| 1\ | --> | [ ]value |
| 01 | --> | M value |
| 10 | --> | T value |

Following provision of the merge operation, the stimulus reset is (M, /) in the toggle flip/flop with preset.

According to the third phase of the extraction procedure, the list of triplets (stimulus reset, stimulus 0, stimulus 1) is transformed into a list of points. The list of points utilized herein is provided in time and voltages. Referring to FIG. 12, the transformation of /, \, M and T into time and voltage list of points is shown. Line 64 represents the transformation of edge value /. Line 66 represents that transformation of edge value \. Line 68 represents the transformation of the M value and line 70 represents the transformation of the T value.

From the above, the stimuli for providing CP to Q delay measurement (i.e., stimulus reset, stimulus 1, stimulus 0) is for a D flip/flop:

CDN=111

CP=///

D=010

Using the following exemplary inputted technology parameters ($V_{SS}$=0 volts, $V_{DD}$=3.3 volts, rise time=0.1 ns, fall time=0.1 ns, and bit cycle=20 ns), this stimuli may be converted to a list of points. Such a stimuli illustrated as a list of points (time, voltage) comprises:

| CDN | -> | (0.0ns 3.3V) | (60.0ns 3.3V) | | |
|---|---|---|---|---|---|
| CP | -> | (0.0ns 0V) | (4.0ns 0V) | (4.1ns 3.3V) | (14.1ns 3.3V) |
| | | (14.2ns 0V) | (24.0ns 0V) | (24.1ns 3.3V) | (34.1ns 3.3v) |
| | | (34.2ns 0V) | (44.0ns 0V) | (44.1ns 3.3V) | (54.1ns 3.3V) |
| | | (54.2ns 0V) | (60.0ns 0V) | | |

-continued

| D | -> | (0.0ns 0V) (20.0ns 0V) (20.1ns 3.3V) (40.0ns 3.3V) |
|---|---|---|
| | | (40.1ns 0V) (60.0ns 0V) |

Referring to FIG. 13, this list of points stimuli is illustrated as clock input and data input waveforms. In particular, the clock input CP is represented by line 72 and the data D is represented by line 74. As shown, CP is equal to $V_{SS}$ or 0 volts from time t=0–4 ns, t=14.2–24 ns, t=34.2 ns–34 ns, and t=54.2 to 60 ns. CP is equal to $V_{DD}$ or 3.3 volts from time t=4.1–14.1 ns, 24.1 ns–34.1 ns, and 44.1 ns–54.1 ns.

As shown by line 74, the D input is equal to $V_{SS}$ from time t=0–24 ns and t=40.1 ns–60 ns. The D input is equal to $V_{DD}$ or 3.3 volts from time t=20.1 ns–40 ns.

The stimuli for providing the CP to Q delay for the toggle flip/flop with clear is:

CDN=011

CP=0//

Again utilizing the inputted technology parameters ($V_{SS}$=0 volts, $V_{DD}$=3.3 volts, rise time=0.1 ns, fall time=0.1 ns, and bit cycle=20 ns), this stimuli may be converted to a list of points. Such a stimuli illustrated as a list of points (time, voltage) comprises:

| CDN -> | (0.0ns 0V) | (20.0ns 0V) | (20.1ns 3.3V) | (60.0ns 3.3V) |
|---|---|---|---|---|
| CP -> | (0.0ns 0V) | (24.0ns 0V) | (24.1ns 3.3V) | (34.1ns 3.3V) |
| | (34.2ns 0V) | (44.0ns 0V) | (44.1ns 3.3V) | (54.1ns 3.3V) |
| | (54.2ns 0V) | (60.0ns 0V) | | |

Referring to FIG. 14, the time and voltage representations (i.e., list of points) from above are shown for the toggle flip/flop with clear pin. The clock CP is represented by line 76 and the clear input (CDN) is represented by line 78.

In particular, clock CP is equal to $V_{SS}$ or 0 volts from time t=0–24 ns, t=34.2–44 ns, and 54.2 ns–60 ns. The clock CP is equal to $V_{DD}$ or 3.3 volts from time t=24.1 ns–34.1 ns, and 44.1 ns–54.1 ns. The clear pin CDN, as shown by line 78, is equal to $V_{SS}$ or 0 volts from time t=0–20 ns and is equal to $V_{DD}$ or 3.3 volts from time t=20.1 ns–60 ns.

The stimuli for providing the CP to Q delay for the toggle flip/flop with preset is:

SDN=M11

CP=///

Again utilizing the inputted technology parameters ($V_{SS}$=0 volts, $V_{DD}$=3.3 volts, rise time=0.1 ns, fall time=0.1 ns, and bit cycle=20 ns), this stimuli may be converted to a list of points. Such a stimuli illustrated as a list of points (time, voltage) comprises:

| SDN -> | (0.0ns 0V) | (20.0ns 0V) | (20.1ns 3.3V) | (60.0ns 3.3V) |
|---|---|---|---|---|
| CP -> | (0.0ns 0V) | (4.0ns 0V) | (4.1ns 3.3V) | (14.1ns 3.3V) |
| | (14.2ns 0V) | (24.0ns 0V) | (24.1ns 3.3V) | (34.1ns 3.3V) |
| | (34.2ns 0V) | (44.0ns 0V) | (44.1ns 3.3V) | (54.1ns 3.3V) |
| | (54.2ns 0V) | (60.0ns 0V) | | |

Referring to FIG. 15, the time and voltage representations (i.e., list of points) from above are shown for the toggle flip/flop with preset pin. The clock CP is represented by line 80 and the preset input (SDN) is represented by line 82.

In particular, CP as shown by line 80, is equal to $V_{SS}$ or 0 volts from time t=0–4 ns, time t=14.2 ns–24 ns, time t=34.2 ns–44 ns, and from time t=54.2 ns–60 ns. CP is equal to $V_{DD}$ or 3.3 volts from time t=4.1 ns–14.1 ns, time t=24.1 ns t 34.1 ns, and time t=44.1 ns–54.1 ns. As represented by line 82, the preset input SDN is equal to $V_{SS}$ or 0 volts from time t=0–2.0 ns. The preset input SDN is equal to $V_{DD}$ or 3.3 volts from time t=2.1 ns–60 ns.

Stimuli generator 10 provides stimuli extraction for the clear and preset pin to the output of the cell. This extraction comprises a mix of the previously described combinatorial input and clock pins. Similar to the previously discussed methods of extraction, the described embodiment comprises three phases for providing the stimulus extraction.

In phase one of the extraction, the provided or inputted truth table shown below as Table 15 is fully expanded by replacing "don't care" character symbols by 0 and 1 to the truth table shown in Table 16.

TABLE 15

| CDN | SDN | CP | D | S | S | Q | QN |
|-----|-----|----|----|----|----|----|----|
| 0 | 0 | — | — | — | 0 | 0 | 0 |
| 0 | 1 | — | — | — | 0 | 0 | 1 |
| 1 | 0 | — | — | — | 1 | 1 | 0 |
| 1 | 1 | 0 | — | 0 | 0 | 0 | 1 |
| 1 | 1 | 0 | — | 1 | 1 | 1 | 0 |
| 1 | 1 | 1 | — | 0 | 0 | 0 | 1 |
| 1 | 1 | 1 | — | 1 | 1 | 1 | 0 |
| 1 | 1 | / | 0 | — | 0 | 0 | 1 |
| 1 | 1 | / | 1 | — | 1 | 1 | 0 |

The expanded truth table is shown below as Table 16.

TABLE 16

| Line | CDN | SDN | CP | D | S | S | Q | QN |
|------|-----|-----|----|----|----|----|----|----|
| 1 | 0 | 0 | 0 | 0 | 0 | 0 | 0 | 0 |
| 2 | 0 | 0 | 0 | 0 | 1 | 0 | 0 | 0 |
| 3 | 0 | 0 | 0 | 1 | 0 | 0 | 0 | 0 |
| 4 | 0 | 0 | 0 | 1 | 1 | 0 | 0 | 0 |
| 5 | 0 | 0 | 1 | 0 | 0 | 0 | 0 | 0 |
| 6 | 0 | 0 | 1 | 0 | 1 | 0 | 0 | 0 |
| 7 | 0 | 0 | 1 | 1 | 0 | 0 | 0 | 0 |
| 8 | 0 | 0 | 1 | 1 | 1 | 0 | 0 | 0 |
| 9 | 0 | 1 | 0 | 0 | 0 | 0 | 0 | 1 |
| 10 | 0 | 1 | 0 | 0 | 1 | 0 | 0 | 1 |
| 11 | 0 | 1 | 0 | 1 | 0 | 0 | 0 | 1 |
| 12 | 0 | 1 | 0 | 1 | 1 | 0 | 0 | 1 |
| 13 | 0 | 1 | 1 | 0 | 0 | 0 | 0 | 1 |
| 14 | 0 | 1 | 1 | 0 | 1 | 0 | 0 | 1 |
| 15 | 0 | 1 | 1 | 1 | 0 | 0 | 0 | 1 |
| 16 | 0 | 1 | 1 | 1 | 1 | 0 | 0 | 1 |
| 17 | 1 | 0 | 0 | 0 | 0 | 1 | 1 | 0 |
| 18 | 1 | 0 | 0 | 0 | 1 | 1 | 1 | 0 |
| 19 | 1 | 0 | 0 | 1 | 0 | 1 | 1 | 0 |
| 20 | 1 | 0 | 0 | 1 | 1 | 1 | 1 | 0 |
| 21 | 1 | 0 | 1 | 0 | 0 | 1 | 1 | 0 |
| 22 | 1 | 0 | 1 | 0 | 1 | 1 | 1 | 0 |
| 23 | 1 | 0 | 1 | 1 | 0 | 1 | 1 | 0 |
| 24 | 1 | 0 | 1 | 1 | 1 | 1 | 1 | 0 |
| 25 | 1 | 1 | 0 | 0 | 0 | 0 | 0 | 1 |
| 26 | 1 | 1 | 0 | 0 | 1 | 1 | 1 | 0 |
| 27 | 1 | 1 | 0 | 1 | 0 | 0 | 0 | 1 |
| 28 | 1 | 1 | 0 | 1 | 1 | 1 | 1 | 0 |
| 29 | 1 | 1 | 1 | 0 | 0 | 0 | 0 | 1 |
| 30 | 1 | 1 | 1 | 0 | 1 | 1 | 1 | 0 |
| 31 | 1 | 1 | 1 | 1 | 0 | 0 | 0 | 1 |
| 32 | 1 | 1 | 1 | 1 | 1 | 1 | 1 | 0 |
| 33 | 1 | 1 | / | 0 | 0 | 0 | 0 | 1 |
| 34 | 1 | 1 | / | 0 | 1 | 0 | 0 | 1 |
| 35 | 1 | 1 | / | 1 | 0 | 1 | 1 | 0 |
| 36 | 1 | 1 | / | 1 | 1 | 1 | 1 | 0 |

During the second phase of extraction, the expanded truth table is searched with respect to the following preselected conditions. First, the truth table is sorted into lists of active and inactive lines. The active list of lines includes all corresponding lines where either CDN and/or SDN are equal to 0. Table 17 is a first active list and represents the lines where CDN=0 and SDN=0.

TABLE 17

| CDN | SDN | CP | D | S | S | Q | QN |
|-----|-----|----|----|----|----|----|----|
| 0 | 0 | 0 | 0 | 0 | 0 | 0 | 0 |
| 0 | 0 | 0 | 0 | 1 | 0 | 0 | 0 |
| 0 | 0 | 0 | 1 | 0 | 0 | 0 | 0 |
| 0 | 0 | 0 | 1 | 1 | 0 | 0 | 0 |
| 0 | 0 | 1 | 0 | 0 | 0 | 0 | 0 |
| 0 | 0 | 1 | 0 | 1 | 0 | 0 | 0 |
| 0 | 0 | 1 | 1 | 0 | 0 | 0 | 0 |
| 0 | 0 | 1 | 1 | 1 | 0 | 0 | 0 |

Table 18 is a second active list and represents the lines where CDN=0 and SDN=1.

TABLE 18

| CDN | SDN | CP | D | S | S | Q | QN |
|-----|-----|----|----|----|----|----|----|
| 0 | 1 | 0 | 0 | 0 | 0 | 0 | 1 |
| 0 | 1 | 0 | 0 | 1 | 0 | 0 | 1 |
| 0 | 1 | 0 | 1 | 0 | 0 | 0 | 1 |
| 0 | 1 | 0 | 1 | 1 | 0 | 0 | 1 |
| 0 | 1 | 1 | 0 | 0 | 0 | 0 | 1 |
| 0 | 1 | 1 | 0 | 1 | 0 | 0 | 1 |
| 0 | 1 | 1 | 1 | 0 | 0 | 0 | 1 |
| 0 | 1 | 1 | 1 | 1 | 0 | 0 | 1 |

Table 19 is a third active list and represents the lines where CDN=1 and SDN=0.

TABLE 19

| CDN | SDN | CP | D | S | S | Q | QN |
|-----|-----|----|----|----|----|----|----|
| 1 | 0 | 0 | 0 | 0 | 1 | 1 | 0 |
| 1 | 0 | 0 | 0 | 1 | 1 | 1 | 0 |
| 1 | 0 | 0 | 1 | 0 | 1 | 1 | 0 |
| 1 | 0 | 0 | 1 | 1 | 1 | 1 | 0 |
| 1 | 0 | 1 | 0 | 0 | 1 | 1 | 0 |
| 1 | 0 | 1 | 0 | 1 | 1 | 1 | 0 |
| 1 | 0 | 1 | 1 | 0 | 1 | 1 | 0 |
| 1 | 0 | 1 | 1 | 1 | 1 | 1 | 0 |

The inactive list includes the lines corresponding to the combination where CDN and SDN are both 1. The "inactive" list is provided below as Table 20.

TABLE 20

| CDN | SDN | CP | D | S | S | Q | QN |
|-----|-----|----|----|----|----|----|----|
| 1 | 1 | 0 | 0 | 0 | 0 | 0 | 1 |
| 1 | 1 | 0 | 0 | 1 | 1 | 1 | 0 |
| 1 | 1 | 0 | 1 | 0 | 0 | 0 | 1 |
| 1 | 1 | 0 | 1 | 1 | 1 | 1 | 0 |
| 1 | 1 | 1 | 0 | 0 | 0 | 0 | 1 |
| 1 | 1 | 1 | 0 | 1 | 1 | 1 | 0 |
| 1 | 1 | 1 | 1 | 0 | 0 | 0 | 1 |
| 1 | 1 | 1 | 1 | 1 | 1 | 1 | 0 |
| 1 | 1 | / | 0 | 0 | 0 | 0 | 1 |
| 1 | 1 | / | 0 | 1 | 0 | 0 | 1 |
| 1 | 1 | / | 1 | 0 | 1 | 1 | 0 |
| 1 | 1 | / | 1 | 1 | 1 | 1 | 0 |

Referring to the active lists (i.e., Tables 17–19), stimuli generator 10 searches for "force to zero" stimulus and "force to one" stimulus. The "force to zero" stimulus and "force to one" stimulus are searched with the corresponding, previously determined stimulus reset described above.

Such searching comprises reading and selecting lines of the respective active lists which satisfy a preselected condition. In particular, stimuli generator 10 rejects lines therein for which the state does not change. Next, the adjacent line of the line is searched in the inactive list. The adjacent line has identical values for the input pins, except for the input pin on which the delay is measured and for the clock pins. The adjacent line should change the state at the output of the cell and the output values should be different between both lines.

If the adjacent line is ambiguous, then the same procedure as described above with respect to the clock is used to determine the adjacent line. For a D flip/flop with preset and clear and delay CDN to Q, an adjacent line is rejected for any of the following three reasons or preselected conditions:

Reason 1: The adjacent line is rejected if the state does not change from input to output.

Reason 2: The adjacent line is rejected if it is not in the inactive list (i.e., Table 20).

Reason 3: The adjacent line is rejected if the output values of the searched line and the adjacent thereof are not different.

Referring to the expanded truth table shown in Table 16, the odd lines within lines 1–15, the even lines within lines 18–24, and lines 25–33 and 35 are all rejected for reason 1. The even lines within lines 2–8, the odd lines within lines 17–23, and lines 34 and 36 are all rejected for reason 2. Lines 10 and 14 are rejected for reason 3. Table 21 represents the adjacent line(s) to the corresponding line of Table 16.

TABLE 21

| Line | Adjacent 1 | | Adjacent 2 | |
|---|---|---|---|---|
| 2 | 10000 | 110 | 10100 | 110 |
| 4 | 10100 | 110 | 10110 | 110 |
| 6 | 10000 | 110 | 10100 | 110 |
| 8 | 10100 | 110 | 10110 | 110 |
| 10 | 11/01 | 001 | | |
| 12 | 11/10 | 110 | | |
| 14 | 11/10 | 001 | | |
| 16 | 11/10 | 001 | | |
| 17 | 00001 | 001 | 00101 | 001 |
| 19 | 00011 | 001 | 00111 | 001 |
| 21 | 00001 | 001 | 00101 | 001 |
| 23 | 00011 | 001 | 00111 | 001 |

The search in the second phase of the extraction for stimuli for providing measurement of the delay from either clear or preset to output provides two "force to 0" stimuli. Individually following a stimulus reset (11/1), the "force to 0" stimuli individually are 0101, 0111 which correspond to lines 12, 16 of the expanded truth table of Table 16.

Stimuli for enabling measurement of rise and fall delay (i.e, $T_{rise}$, $T_{fall}$) for the D flip/flop with clear and preset input are also searched in the second phase. The stimuli extraction is the same for the combinatorial input to output delay described above except the lines in the active list are rejected. Table 22 below provides the adjacent lines of respective lines 1–24 of the expanded truth table in Table 16.

TABLE 22

| Line | Adjacent |
|---|---|
| 1 | 1000 |
| 2 | 1000 |
| 3 | 1001 |
| 4 | 1001 |
| 5 | 1010 |
| 6 | 1010 |
| 7 | 1011 |
| 8 | 1011 |
| 9 | 1100 |
| 10 | 1100 |
| 11 | 1101 |

TABLE 22-continued

| Line | Adjacent |
|---|---|
| 12 | 1101 |
| 13 | 1110 |
| 14 | 1110 |
| 15 | 1111 |
| 16 | 1111 |
| 17 | 0000 |
| 18 | 0000 |
| 19 | 0001 |
| 20 | 0001 |
| 21 | 0010 |
| 22 | 0010 |
| 23 | 0011 |
| 24 | 0011 |

From the searching operations, plural result stimulus which satisfy the preselected conditions are extracted. Line 1 from the expanded truth table shown as Table 16 provides result one wherein stimulus 0=0000, stimulus 1=1000, and stimulus reset=stimulus 0. Line 3 provides result two wherein stimulus 0=0001, stimulus 1=1001, and stimulus reset=stimulus 0. Line 5 provides result three wherein stimulus 0=0010, stimulus 1=1010, and stimulus reset=stimulus 0. Line 7 provides result four wherein stimulus 0=0011, stimulus 1=1011, and stimulus reset=stimulus 0. Thus, the extracted stimulus are result 1 (0000, 1000), result 2 (0001, 1001), result 3 (0010, 1010) and result 4 (0011, 1011).

Next, in phase 3 of the extraction, the stimuli for providing measurement of delay from CDN to Q of the D flip/flop is converted to a list of points. The "force to" stimuli (11/1, 0101) is described in Table 23:

TABLE 23

| CP | = | 0/ |
|---|---|---|
| D | = | 11 |
| SDN | = | 11 |
| CDN | = | 10 |

The first column of Table 23 corresponds to stimulus reset and the second column corresponds to force to 0 stimulus.

This behavioral representation of the stimulus is converted to a list of points using the following technology parameters: $V_{SS}$=0V, $V_{DD}$=3.3V, rise time=0.1 ns, fall time= 0.1 ns and bit cycle –20 ns. Thus, the list of points stimuli for providing measurement of CDN to Q is:

| CP -> | (0.0ns, 0V) | (24.0ns, 0V) | (24.1ns, 3.3V) | (34.1ns, 3.3V) |
|---|---|---|---|---|
| | (34.2ns, 0V) | (40.0ns, 0V) | | |
| D -> | (0.0ns, 3.3V) | (40.0ns, 3.3V) | | |
| SDN -> | (0.0ns, 3.3V) | (40.0ns, 3.3V) | | |
| CDN -> | (0.0ns, 3.3V) | (20.0ns, 3.3V) | (20.1ns, 0V) | 40.0ns, 0V) |

Referring to FIG. 16, the list of points stimuli for providing measurement of delay form CDN to Q in a D flip/flop is shown in time and voltage waveforms. The clock pulse CP is represented by line 84 and the clear input CDN is represented by line 86. As shown by line 84, the clock is 0 volts from time t=0–24 ns, and from time t=34.2 ns–40 ns. The clock is equal to $V_{DD}$ or 3.3 volts from time t=24.1 ns to 34.1 ns. The clear input CDN as shown by line 86 is equal to $V_{DD}$ or 3/3 volts from time t=0–20 ns. The clear input is equal to $V_{SS}$ or 0 volts from time t=20.1 ns to 40 ns.

The result 1 stimuli for providing rise and fall delay measurement (i.e., $T_{rise}$, $T_{fall}$) for the D flip/flop with clear and preset input are shown in Table 24.

TABLE 24

| CP | = | 000 |
|---|---|---|
| D | = | 000 |
| SDN | = | 000 |
| CDN | = | 101 |

The first column of Table 24 corresponds to stimulus reset. The second and third columns correspond to stimulus 1 and stimulus 0, respectively.

This behavioral representation of the stimuli is converted to a list of points using the technology parameters described with reference to the "force to" stimulus. The list of points stimuli for providing rise/fall delay of the D flip/flop is:

| CP -> | (0.0ns, 0V) | (60.0ns, 0V) | |
|---|---|---|---|
| D -> | (0.0ns, 0V) | (60.0ns, 0V) | |
| SDN -> | (0.0ns, 0V) | (60.0ns, 0V) | |
| CDN -> | (0.0ns, 3.3V) | (20.0ns, 3.3V) | (20.1ns, 0V) |
| | (40.0ns, 0V) | (40.1ns, 3.3V) | (60ns, 3.3V) |

The invention allows the automatic generation of stimuli in terms SPICE™ voltage sources that must be applied to a cell for a pin to pin delay characterization. The user just needs to set the technology dependent parameters and to specify the particular delay measurements to perform.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A circuit behavioral information analysis apparatus comprising:
   an interface configured to receive a truth table including a plurality of lines which define a logical behavior of a circuit which includes plural input pins and at least one output pin, the lines of the truth table individually include stimulus for the input pins of the circuit and output information present at the at least one output pin of the circuit responsive to the respective stimulus, the interface being further configured to receive a measurement specification which identifies at least one of the input pins and the output pin of the circuit to be analyzed; and
   a processor coupled with the interface and configured to receive the measurement specification including the identified at least one input pin and output pin of the circuit and to sort the truth table into an active list and an inactive list to extract stimulus from the truth table responsive to the received measurement specification.

2. The apparatus according to claim 1 wherein the interface is configured to receive technology parameters, and the processor is configured to convert extracted stimulus comprising logic behavioral stimulus to list of points stimulus.

3. The apparatus according to claim 1 wherein the measurement specification identifies the at least one input pin and the output pin to enable determination of pin to pin delay characterization.

4. The apparatus according to claim 1 wherein the processor is further configured to expand the truth table to extract the stimulus.

5. The apparatus according to claim 1 wherein the processor is further configured to select a line of the truth table responsive to the identified at least one input pin of the measurement specification to extract the stimulus.

6. The apparatus according to claim 5 wherein the processor is further configured to determine an adjacent line of the selected line, and to determine whether output information of the selected line and output information of the adjacent line are different to extract the stimulus.

7. The apparatus according to claim 6 wherein the processor is configured to identify stimulus of the selected line and another line having different input pin values corresponding to the identified input pin and identical input pin values corresponding to all other input pins to determine the adjacent line.

8. The apparatus according to claim 1 wherein the processor is further configured to determine whether stimulus is ambiguous to extract the stimulus.

9. The apparatus according to claim 1 wherein the processor is further configured to search the truth table responsive to a preselected condition to extract the stimulus.

10. The apparatus according to claim 1 wherein the processor is further configured to extract the stimulus without application of the stimulus to the circuit.

11. The apparatus according to claim 1 wherein the truth table comprises lines including digital stimulus and digital output information.

12. A method of analyzing behavioral information of a circuit comprising:
    providing a truth table including a plurality of lines which define a logical behavior of a circuit which includes plural input pins and at least one output pin, the lines of the truth table individually include stimulus for the input pins of the circuit and output information present at the at least one output pin of the circuit responsive to the respective stimulus;
    providing a measurement specification which identifies at least one of the input pins and the output pin of the circuit to be analyzed; and
    using a processor, extracting stimulus from the truth table responsive to the measurement specification, the extracting comprising sorting the truth table into an active list and an inactive list.

13. The method according to claim 12 further comprising:
    providing technology parameters; and
    converting the extracted stimulus comprising logic behavioral stimulus to list of points stimulus using the processor.

14. The method according to claim 12 further comprising providing the measurement specification to enable determination of pin to pin delay characterization.

15. The method according to claim 12 wherein the extracting using the processor further comprises expanding the truth table.

16. The method according to claim 12 wherein the extracting using the processor further comprises selecting a line of the truth table responsive to the at least one identified input pin.

17. The method according to claim 16 wherein the extracting using the processor further comprises:
    determining an adjacent line of the selected line; and
    determining whether output information of the selected line and output information of the adjacent line are different.

18. The method according to claim 17 wherein the determining the adjacent line comprises identifying stimulus of the selected line and another line having different input pin values corresponding to the identified input pin and identical input pin values corresponding to all other input pins.

19. The method according to claim 12 wherein the extracting using the processor further comprises determining whether stimulus is ambiguous.

20. The method according to claim 12 further comprising providing a preselected condition, and wherein the extracting using the processor further comprises searching the truth table responsive to the preselected condition.

21. The method according to claim 12 wherein the extracting using the processor further comprises extracting without application of the stimulus to the circuit.

22. The method according to claim 12 wherein the providing the truth table comprises providing lines including digital stimulus and digital output information.

23. A method of analyzing behavioral information of a circuit comprising:

providing technology parameters;

providing a truth table including a plurality of lines which define a logical behavior of a circuit which includes plural input pins and at least one output pin, the lines of the truth table individually include digital stimulus for the input pins of the circuit and digital output information present at the at least one output pin of the circuit responsive to the respective stimulus;

providing a measurement specification which identifies at least one of the input pins and the output pin of the circuit to be analyzed;

using a processor, extracting stimulus from the truth table responsive to the measurement specification, the extracting stimulus using the processor comprising:

expanding the truth table;

sorting the truth table into an active list and an inactive list;

after the sorting, selecting a line of the truth table responsive to the at least one identified input pin;

determining an adjacent line of the selected line comprising identifying stimulus of the selected line and another line having different input pin values corresponding to the identified input pin and identical input pin values corresponding to all other input pins; and determining whether output information of the selected line and output information of the adjacent line are different; and converting the extracted stimulus comprising logic behavioral stimulus to list of points stimulus.

\* \* \* \* \*

UNITED STATES PATENT AND TRADEMARK OFFICE
CERTIFICATE OF CORRECTION

PATENT NO. : 6,233,723 B1
DATED : May 15, 2001
INVENTOR(S) : Olivier Pribetich

It is certified that error appears in the above-identified patent and that said Letters Patent is hereby corrected as shown below:

Column 1,
Line 12, please delete "if".

Column 10,
Line 63, please insert -- "=" -- after "k=1".
Line 66, please insert -- "=" -- after "k=0".

Column 13,
Line 33, please insert -- \ -- after "1".
Line 33, please delete "[ ]" and insert -- \ -- before "value".

Column 14,
Line 51, please delete "(20.0ns 0V)" and insert -- (2.0ns 0V) --.
Line 51, please delete "(20.1ns 3.3V)" and insert -- (2.1ns 3.3V) --.

Column 19,
Line 24, please insert -- of -- after "terms".

Signed and Sealed this

Thirtieth Day of October, 2001

*Attest:*

*Attesting Officer*

NICHOLAS P. GODICI
*Acting Director of the United States Patent and Trademark Office*